(12) United States Patent
Hedler et al.

(10) Patent No.: US 6,936,928 B2
(45) Date of Patent: Aug. 30, 2005

(54) SEMICONDUCTOR COMPONENT AND METHOD FOR ITS PRODUCTION

(75) Inventors: Harry Hedler, Regensburg (DE); Thorsten Meyer, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/252,449

(22) Filed: Sep. 23, 2002

(65) Prior Publication Data

US 2003/0057567 A1 Mar. 27, 2003

Related U.S. Application Data

(63) Continuation of application No. PCT/DE01/00702, filed on Feb. 23, 2001.

(30) Foreign Application Priority Data

Mar. 23, 2000 (DE) .......................................... 100 14 300

(51) Int. Cl.⁷ .......................... H01L 23/48; H01L 23/52; H01L 29/40
(52) U.S. Cl. .......................... 257/778; 257/737; 438/108
(58) Field of Search ................................ 257/737, 738, 257/778; 438/108

(56) References Cited

U.S. PATENT DOCUMENTS

| | | | |
|---|---|---|---|
| 4,937,653 A | 6/1990 | Blonder et al. ............. 257/739 |
| 5,261,158 A | 11/1993 | Schreiber et al. ............. 29/848 |
| 5,477,087 A | 12/1995 | Kawakita et al. ........... 257/737 |
| 5,508,228 A | 4/1996 | Nolan et al. ................. 438/614 |
| 5,714,252 A | 2/1998 | Hogerton et al. ........... 428/344 |
| 5,874,782 A | 2/1999 | Palagonia .................... 257/778 |
| 5,876,580 A | 3/1999 | Lykins, II ................... 205/104 |
| 5,959,362 A | 9/1999 | Yoshino ...................... 257/778 |
| 6,277,669 B1 * | 8/2001 | Kung et al. ................. 438/106 |
| 6,555,908 B1 * | 4/2003 | Eichelberger et al. ...... 257/737 |
| 2002/0089058 A1 * | 7/2002 | Hedler et al. ............... 257/737 |

FOREIGN PATENT DOCUMENTS

| | | |
|---|---|---|
| EP | 0 609 918 A2 | 8/1994 |
| EP | 0 620 701 A2 | 10/1994 |
| JP | 5 144 823 A | 6/1993 |
| JP | 5 251 455 | 9/1993 |

OTHER PUBLICATIONS

Beine, H.: "Polymer–Flip–Chip–Technologie" [Polymer Flip–Chip Technology], Productronic, Aug. 1996, pp. 26–27.

* cited by examiner

*Primary Examiner*—Phat X. Cao
(74) *Attorney, Agent, or Firm*—Laurence A. Greenberg; Werner H. Stemer; Ralph E. Locher

(57) ABSTRACT

The invention proposes a semiconductor component with a semiconductor chip having a first main side with at least one contact pad thereon. A protective layer is applied on the first main side such that a clearance is provided around the contact pad. It is possible for the semiconductor component to be connected to a substrate using flip-chip bonding. Elevations that are connected to contact pads via conductor runs located on the protective layer are provided on the first main side. The elevations may be produced either by printable materials or by repeated electrodepositing of the ends of the conductor tracks lying opposite the contact pads.

16 Claims, 4 Drawing Sheets

SEMICONDUCTOR COMPONENT AND METHOD FOR ITS PRODUCTION

CROSS REFERENCE TO RELATED APPLICATION

This application is a continuation of copending International Application No. PCT/DE01/00702, filed Feb. 23, 2001, which designated the United States and was not published in English.

BACKGROUND OF THE INVENTION

Field of the Invention

The invention relates to a semiconductor component with a semiconductor chip, which has a first main side with at least one contact pad thereon and a protective layer with a clearance around the one contact pad. It is possible for the semiconductor component to be connected to a substrate by using flip-chip bonding.

There is a fundamental need for connecting semiconductor components to a substrate at the lowest possible cost and for saving as much space as possible. In the past, different forms of a package have evolved that allow, for example, a semiconductor chip to be mounted on a leadframe. The terminal fingers of the leadframe jut out from the housing of the semiconductor component and can be connected to a substrate. Examples of semiconductor components of this type are those known as Small Outline Packages (SOP) or Thin Small Outline Packages (TSOP). In the case of these forms of devices, there is a relatively great distance between the semiconductor component and the substrate. As an alternative to this, semiconductor components with Ball Grid Arrays exist. In these Ball Grid Arrays, solder balls are applied to contact points on the underside of the semiconductor component, and the solder balls establish an electrical connection with contacts of the substrate. Ball Grid Arrays have the advantage that no contact elements protrude beyond the edge of the package. The distance between the semiconductor component and the substrate in the case of Ball Grid Arrays is determined by the diameter of the solder balls. A reduction in the distance is not possible below a certain minimum diameter of the solder balls (around 100 $\mu$m) because of the need to provide reliable electrical connectability.

A reduction in the distance between the semiconductor component and the substrate is possible by new Chip-on-Board (COB) solutions, in which an anisotropically conductive adhesive is used for connecting the semiconductor chip to the substrate. In this case, an adhesive that is provided with tiny metal particles with a diameter of around 5 to 10 $\mu$m is used. The metal particles thereby establish an electrical contact between the contact pads of the semiconductor chip and the contact points on the substrate. However, it must be ensured here that the contact pads on the semiconductor chip have a raised elevation. For this purpose, a special chemical metallization of the contact pads using nickel and gold is carried out as a method step during production.

By using this connection technology between a semiconductor chip and the substrate, an extremely small overall height can be achieved. This height is determined only by the thickness of the adhesive layer; that is to say by the diameter of the metal particles in the adhesive. However, a series of disadvantages also count against this connection technology. To connect the semiconductor chip to the substrate, an extremely high degree of positional accuracy is needed to position the semiconductor chip on the substrate. When it is being applied to the substrate, the semiconductor chip must not be any further than 5 $\mu$m away from its intended position, since the contact pads of the semiconductor chip generally have a diameter of less than 60 $\mu$m. If there is a greater lateral displacement, as indicated above, a poor electrical contact between the contact pad and the contact point of the substrate could be the consequence. Furthermore, the distance between the contact points on the substrate must be of the same order of magnitude as the contact pads of the semiconductor chip. The distance between two contact points should then be a maximum of 100 $\mu$m. As a result, conventional inexpensive methods of producing the substrate can no longer be used, since the standard distance between two contact points of the substrate is 500 to 800 $\mu$m. Instead, expensive thin-film substrates would have to be used. Since the size of the metal particles in the anisotropically conductive adhesive have very small diameters, an extremely exact planarity of the connecting area between the semiconductor chip and the substrate must also be ensured. Last but not least, producing the adhesive with metal particles of the same size, usually consisting of silver, is very complex and cost-intensive.

SUMMARY OF THE INVENTION

It is accordingly an object of the invention to provide a semiconductor component configured for connection to a standard substrate and a method for producing the semiconductor substrate which overcomes the above-mentioned disadvantages of the prior art apparatus and methods of this general type.

In particular, it is an object of the present invention to provide a semiconductor component that can be connected to a substrate in a simple and low-cost way, such that the semiconductor chip can be arranged at the smallest possible distance away from the substrate.

With the foregoing and other objects in view there is provided, in accordance with the invention, a semiconductor component configured for connection to a standard substrate having contact points by using flip-chip bonding. The semiconductor component includes: a semiconductor chip having a first main side with at least two contact pads thereon; a protective layer applied to the first side such that a clearance is configured around the two contact pads; conductor runs located at least partially on the protective layer on the first main side; and a plurality of elevations each connected to a respective one of the contact pads by one of the conductor runs. A distance between two of the plurality of the elevations corresponds to a distance between the contact points of the substrate.

In accordance with an added feature of the invention, the plurality of the elevations taper in a direction away from the main side.

In accordance with an additional feature of the invention, the plurality of the elevations are made from a printable material; each of the plurality of the elevations have an edge region and a vertex region; and one of the conductor runs is directed along the edge region and ends on the vertex region of one of the plurality of the elevations.

In accordance with another feature of the invention, the plurality of the elevations are made from a material selected from a group consisting of a polymer and a polyimide.

In accordance with a further feature of the invention, one of the conductor runs has an end formed by one of the plurality of the elevations; the end of the one of the conductor runs lies opposite one of the two contact pads; the end of the one of the conductor runs has a fissured surface that faces away from the first main side; and the fissured surface is raised with respect to the conductor run and is created by at least one electrodepositing operation.

In accordance with a further added feature of the invention, the end of the one of the conductor runs is formed with a substantially annular shape.

In accordance with a further additional feature of the invention, the end of the one of the conductor runs has a roughened inner or outer edging.

In accordance with yet added feature of the invention, the semiconductor component includes a formation having a fissured surface. The formation is applied on the end of the one of the conductor runs.

In accordance with yet an additional feature of the invention, the formation is made from an electrically conductive material that can be electrodeposited.

In accordance with yet another feature of the invention, the semiconductor component includes an adhesive that shrinks to develop an adhesive force for connecting the semiconductor chip and the substrate.

In accordance with yet a further feature of the invention, the conductor runs are conductor tracks including a copper-nickel-gold laminate.

With the foregoing and other objects in view there is provided, in accordance with the invention, a method for producing semiconductor components that each have a semiconductor chip having a first main side with at least one contact pad, a protective layer configured on the first main side such that a clearance is provided around the contact pad, and elevations located on the first main side. The method includes steps of: structuring the first main side of the semiconductor chips at a wafer level; applying the elevations on the first main side at the wafer level; applying conductor runs to the first main side to connect the contact pads and the elevations; performing the step of applying the conductor runs at a time selected from a group consisting before performing the step of applying the elevations and after performing the step of applying the elevations; and individually separating the semiconductor chips.

In accordance with an added mode of the invention, the elevations are printed on.

In accordance with an additional mode of the invention, the method includes: electrodepositing ends of the conductor runs at least once. In this case, the conductor runs are conductor tracks.

In accordance with another mode of the invention, the method includes: applying a formation having a fissured surface to ends of the conductor runs before electrodepositing ends of the conductor runs. In this case, the conductor runs are conductor tracks.

The invention proposes providing elevations on the first main side of the semiconductor chip. These elevations are connected to respective contact pads via conductor runs that are at least partially located on or above the protective layer. The invention consequently uses the principle of wiring, such that standard substrates with the accustomed distances between two contact points can be used. The elevations are in this case arranged on the first main side of the semiconductor chip in such a way that they coincide with corresponding contact points of the substrate. It goes without saying that this only applies to those elevations on which conductor runs that are connected to contact pads of the semiconductor chip have been applied. The connection between the semiconductor component and the substrate can be performed with inexpensive, nonconducting standard adhesives.

The elevation advantageously tapers in the direction away from the main side. In conjunction with an adhesive for connecting the semiconductor chip and the substrate which shrinks to develop its adhesive force, the semiconductor chip is "drawn onto" the substrate. The "tips" of the elevations make the elevations connect themselves to the corresponding contact points of the substrate. The elevations virtually bore themselves into the substrate.

The elevation advantageously consists of a printable material. This makes it possible to apply the elevations to a multiplicity of semiconductor chips already at the wafer level in a single step. The conductor runs either run over such an elevation or else end on the vertex region of the elevation, running up from the first main side along the edge region and ending on the vertex region of the elevation.

A polymer or a polyimide may be provided, for example, as the material for the elevation. Any other material that can be processed by using a printing process is also conceivable. It goes without saying that it would also be conceivable to apply the elevations on the first main side of the semiconductor chip by an embossing operation.

Alternatively, the elevation includes the end of the conductor run lying opposite the contact pad. The end of the conductor run then has a fissured surface, facing away from the first main side and raised with respect to the conductor run. This fissured surface is created by performing at least one electrodepositing operation. This involves using the principle that raised elevations are produced during electrodepositing. The elevations form on edges and tips during the metal deposition. This effect is in fact undesired when applying the conductor runs. However, the invention specifically exploits this effect, by providing the ends of the conductor runs with a very rough surface when they are applied, if possible. Repeated electrodepositing consequently produces a raised elevation on the end of the conductor run, and this elevation can be used for direct electrical connection to the contact points of the substrate. The raised elevation must in this case be sufficiently high for no short-circuit to be possible between the conductor run and another metallic region on the substrate.

The end of the conductor run is preferably formed with a substantially annular definition. The raised elevation is produced particularly well if the inner and/or outer edging of the substantially annular end of the conductor run is roughened.

In a further alternative, the invention provides that formations having a fissured surface are applied on the ends of the conductor runs lying opposite the contact pads. By making the formation from a material that is electrically conductive and capable of being electrodeposited, the fissured surface can be specifically raised further by the effect described above during the electrodepositing.

The conductor runs are advantageously formed by conductor tracks including a copper-nickel-gold laminate.

The method for producing a semiconductor component with a semiconductor chip, which has at least one contact pad on a first main side and a protective layer on the first main side with a clearance around the at least one contact pad, and which has elevations on the first main side, includes the following steps:

a) structuring the semiconductor chips on the first main side at wafer level;

b) applying the elevations on the first main side at wafer level;

c) applying the conductor runs to the first main side, the contact pads and the elevations being connected to one another and it being possible for step c) to be performed before or after step b); and d) individually separating the semiconductor chips.

Other features which are considered as characteristic for the invention are set forth in the appended claims.

Although the invention is illustrated and described herein as embodied in a semiconductor component and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
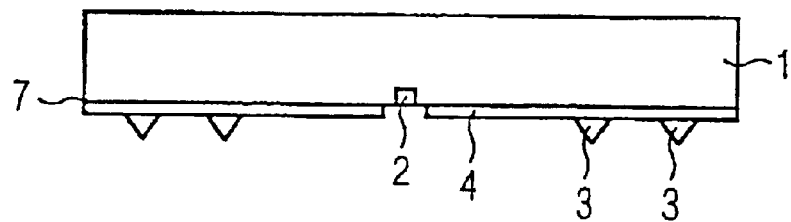
FIG. 1 is a cross sectional view of a semiconductor chip having a first main side with elevations applied thereto.

Referring now to the figures of the drawing in detail and first, particularly, to FIGS. 1 to 4 thereof, there is shown a first embodiment of the invention. A semiconductor chip 1 is provided with at least one contact pad 2 on a first main side 7. In the present exemplary embodiment, the at least one contact pad 2 is located in the center of the semiconductor chip 1. It is possible for a multiplicity of contact pads 2 to be arranged in a row one behind the other. It goes without saying that it is also conceivable for the contact pads 2 to be arranged on the first main side 7 in a number of parallel rows. The contact pads 2 could likewise run along the side edges of the semiconductor chip 1. After the structuring of the semiconductor chip, which takes place at wafer level, the semiconductor chip 1 has a protective layer 4 on the first main side 7. This generally consists of a polyimide or a polymer. There is an opening that just forms a clearance around the contact pads 2. A plurality of elevations 3 are provided on the protective layer 4. In the present exemplary embodiment there are two elevations 3 respectively arranged symmetrically about the contact pad 2. The number of elevations 3 will generally correspond to the number of contact pads 2. However, this is not absolutely necessary.

Figure 2:
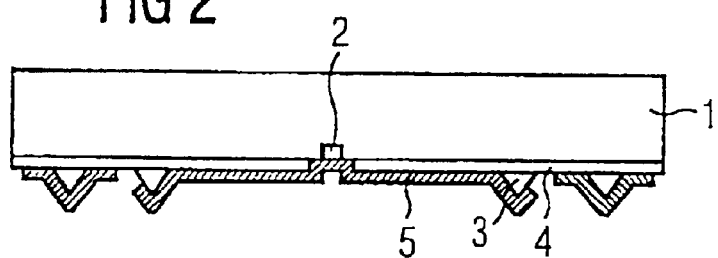
FIG. 2 shows the semiconductor chip after conductor runs have been applied.

It can be seen from FIG. 2 that conductor runs 5 run between the contact pad 2 and the elevations 3. The conductor runs 5 may in this case run over an elevation, as represented, for example, in the case of the elevation on the far left or far right. The conductor runs 5 may, however, already end on the vertex region of an elevation. Generally, a conductor run will connect an elevation to a contact pad 2.

Figure 3:
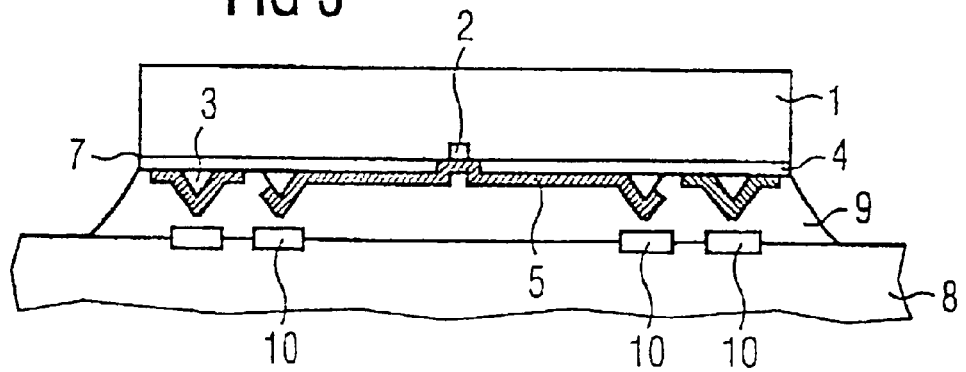
FIG. 3 shows the semiconductor chip on a substrate with an uncured adhesive for connecting the semiconductor chip and the substrate.
Figure 4:
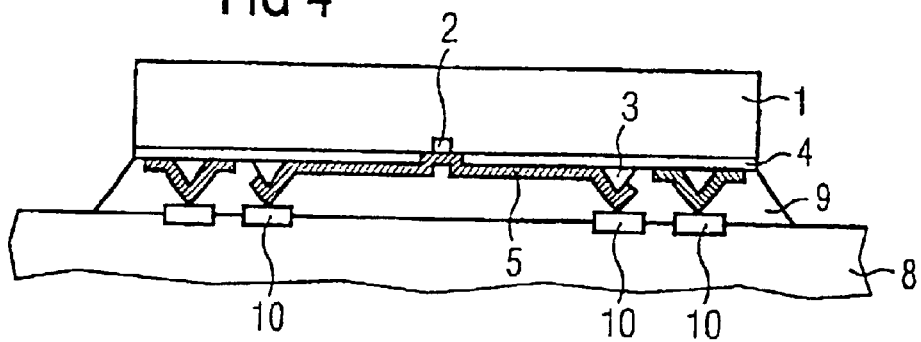
FIG. 4 shows the semiconductor chip on the substrate after the adhesive has cured.
Figure 5A:
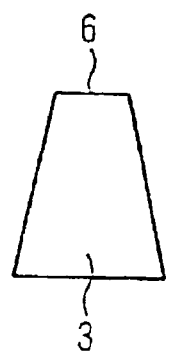
FIGS. 5A, 6A, 7A, 8A, and 9A are cross sectional views of different elevations.
Figure 5B:
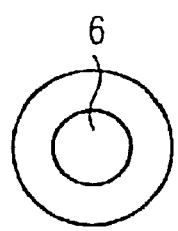
FIGS. 5B, 6B, 7B, 8B, and 9B are plan views of the different elevations.

A semiconductor chip prepared in this way can be electrically connected to a substrate 8 using flip-chip bonding. The elevations 3 thereby assume the function of a wiring interposer. This means that the distances between the elevations 3 are adapted to the distances between the contact points 10 of the substrate 8. This allows substrates 8 that are produced by standard methods to be used. The connection between the semiconductor chip 1 and the substrate 8 is performed by an adhesive 9, which shrinks to attain its adhesive force. In FIG. 3, the adhesive 9 is in a state in which it has not yet fully cured. There is still no electrical connection, or only an inadequate electrical connection, between the elevations 3 formed as contacts and the contact points 10 of the substrate. The shrinking of the adhesive 9 has the effect that the semiconductor chip 1 is "drawn onto" the substrate 8. The fact that the elevations 3 are advantageously tapered in the direction away from the main side 7 means that the tips of the elevations 3 bore themselves into the metallic contact points 10 of the substrate 8. As a result, a reliable electrical contact is made possible. In FIG. 4, the adhesive 9 has cured, so that the conductor runs on the elevations 3 are in good electrical contact with the contact points 10 of the substrate.

Since the substrate 8 can be produced using standard technology, the distances between two contact points 10 and the size of the contact points 10 are made to be relatively large. The diameter of a contact point of this type may be up to 300 μm. The distance between two contact points is between 500 and 800 μm. As a result, relatively easy positioning of the semiconductor chip 1 on the substrate 8 is possible. The tools and method steps of standard Surface Mount Technology (STM) can therefore be used.

FIGS. 5 to 9 show various possibilities for configuring the elevation 3. FIGS. 5A, 6A, 7A, 8A, and 9A are cross sectional views of different elevations. FIGS. 5B, 6B, 7B, 8B, and 9B are plan views of the respective elevations. From FIGS. 5A and 5B it is evident that the elevation has the form of a cone cut off at the tip. The more pointed that the outer end 6 of the elevation 3 is made, the greater the force with which the elevation 3 can bore itself into the contact point 10 of the substrate 8. Also produced at the same time is the edged surface that is desired for the electrodepositing, so that a further raised elevation is obtained by applying the conductor runs using the electrodepositing process.

Figure 6A:
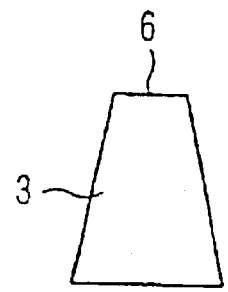
Figure 6B:
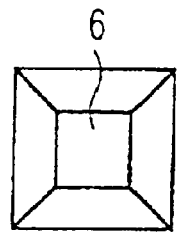
Figure 7A:
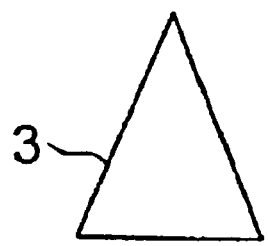
Figure 7B:
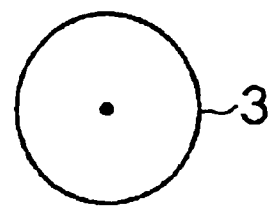
Figure 8A:
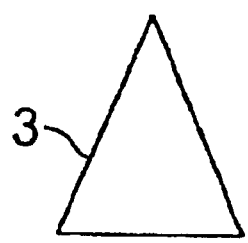
Figure 8B:
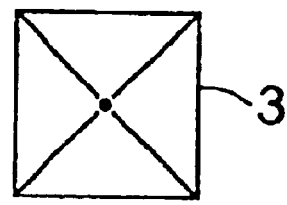
Figure 9A:
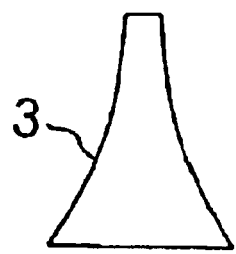
Figure 9B:
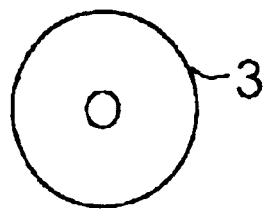

It is evident from FIGS. 6A and 6B that the elevation 3 may also have the form of a pyramid cut off at the tip. In FIGS. 7A and 7B, the elevation is made in the form of a cone. FIGS. 8A and 8B show the elevation 3 as a pyramid, on which the tip is not cut off. The edge region of the elevation 3 does not necessarily have to be made planar or straight; it may also have a curvature, as represented for example in FIGS. 9A and 9B.

Figure 10:
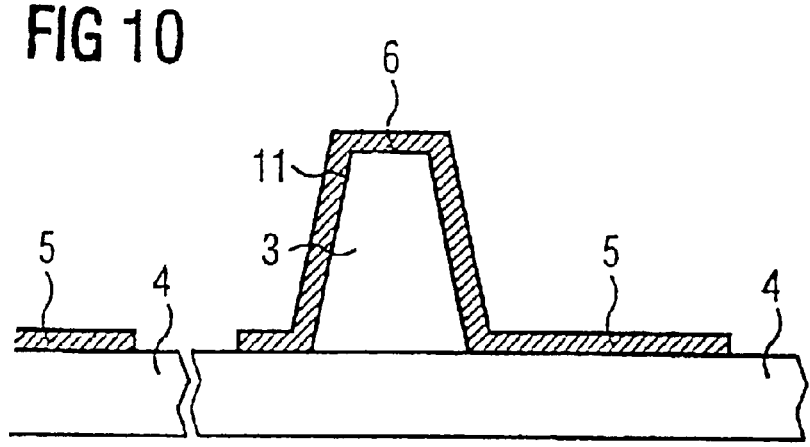
FIG. 10 is a cross sectional view showing examples for applying the conductor runs.

FIG. 10 shows two different possibilities for applying the conductor runs 5 to the elevation 3. In the exemplary embodiment on the left, the conductor run 5 runs on the protective layer 4 along the edge region 11 to the outer end, which it preferably completely covers. Alternatively, it is also conceivable, as shown in the exemplary embodiment on the right, to make the conductor run run over the elevation 3.

The elevation 3 may consequently be covered completely by the conductor run 5.

The elevation 3 is preferably printed onto the first main side of the semiconductor chip while it is still in the wafer assembly. A polymer or a polyimide is particularly suitable for this purpose. It goes without saying that it would also be conceivable to apply the elevations 3 to the first main side 7 in an embossing operation.

Figure 11:
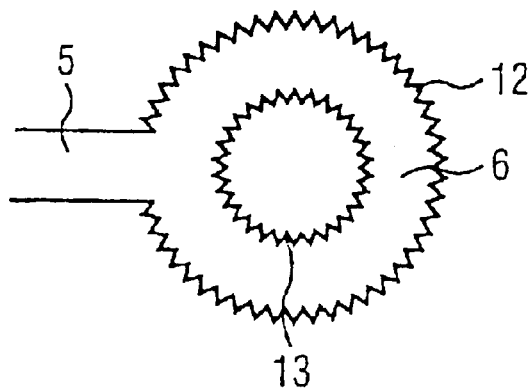
FIG. 11 shows an exemplary embodiment of an end of a conductor track.
Figure 12:
FIG. 12 shows an end of a conductor track onto which a formation with a fissured surface has been applied.

FIG. 11 shows a further exemplary embodiment, in which the elevation 3 is produced in some other way. The end of a conductor run 5 which is preferably formed in an annular manner is represented. After a electrodepositing process, the outer and inner edging 12, 13 generally have a rough surface. By repeated electrodepositing, further tips and raised elevations are produced along these rough surfaces, becoming still further defined by each electrodepositing operation. As a result, the desired elevations are produced. Normally, the raised elevations produced by the electrodepositing are undesired and are removed using complex method steps. The invention, however, specifically envisages the utilization of these raised elevations. The end of the conductor track could also have the form of a full-area circle or ellipsoid, in which case elevations would only occur along the outer edging.

If the raised elevations are not defined enough by the repeated electrodepositing, it is also conceivable to apply a any desired formation with a fissured surface to the end 5 of the conductor track. The fissured surface can be further raised by the electrodepositing.

The invention makes it possible in the way described to keep the distance between the semiconductor chip 1 and the substrate 8 extremely small. Distances of only 10 μm are possible. The distances that can be attained by electrodepositing or printing on elevations are adequate to ensure that no short-circuits arise between the conductor runs 5 on the semiconductor chip 1 and a metallization on the substrate 8.

We claim:

1. A semiconductor component configured for connection to a standard substrate having contact points by using flip-chip bonding, the semiconductor component comprising:
    a semiconductor chip having a first main side with at least two contact pads thereon;
    a protective layer applied to said first side such that a clearance is configured around said two contact pads;
    conductor runs located at least partially on said protective layer on said first main side;
    a plurality of elevations each connected to a respective one of said contact pads by one of said conductor runs;
    said plurality of said elevations having tips, said tips being bored into the contact points of the substrate to make an electrical contact, a distance between two of said plurality of said elevations corresponding to a distance between the contact points of the substrate; and
    an adhesive developing a force between said semiconductor chip and the substrate for fixing a position of said elevations and the contact points after hardening.

2. The semiconductor component according to claim 1, wherein: said plurality of said elevations taper in a direction away from said main side.

3. The semiconductor component according to claim 1, wherein:
    said plurality of said elevations are made from a printable material;
    each of said plurality of said elevations have an edge region and a vertex region; and
    one of said conductor runs is directed along said edge region and ends on said vertex region of one of said plurality of said elevations.

4. The semiconductor component according to claim 1, wherein: said plurality of said elevations are made from a material selected from a group consisting of a polymer and a polyimide.

5. The semiconductor component according to claim 1, wherein:
    one of said conductor runs has an end formed by one of said plurality of said elevations;
    said end of said one of said conductor runs lies opposite one of said two contact pads;
    said end of said one of said conductor runs has a fissured surface that faces away from said first main side; and
    said fissured surface is raised with respect to said conductor run and is created by at least one electrodepositing operation.

6. The semiconductor component according to claim 5, wherein: said end of said one of said conductor runs is formed with a substantially annular shape.

7. The semiconductor component according to claim 6, wherein: said end of said one of said conductor runs has a roughened edging; and said edging is selected from a group consisting of an inner edging and an outer edging.

8. The semiconductor component according to claim 7, comprising: a formation having a fissured surface; said formation being applied on said end of said one of said conductor runs.

9. The semiconductor component according to claim 6, comprising: a formation having a fissured surface; said formation being applied on said end of said one of said conductor runs.

10. The semiconductor component according to claim 1, comprising:
    a formation having a fissured surface;
    one of said conductor runs having an end formed by one of said plurality of said elevations;
    said end of said one of said conductor runs lying opposite one of said two contact pads; and
    said formation being applied on said end of said one of said conductor runs.

11. The semiconductor component according to claim 10, wherein: said formation is made from an electrically conductive material that can be electrodeposited.

12. The semiconductor component according to claim 1, wherein: said conductor runs are conductor tracks including a copper-nickel-gold laminate.

13. A method for producing semiconductor components configured for connection to a standard substrate having contact points by using flip-chip bonding, the method which comprises:
    providing each semiconductor component with a semiconductor chip having a first main side with at least two contact pads thereon;
    applying a protective layer to the first side such that a clearance is configured around the two contact pads;
    structuring the first main side of the semiconductor chips at a wafer level;
    applying elevations on the first main side at the wafer level, the elevations having tips, the tips being bored into the contact points of the substrate to make an electrical contact, a distance between two of the elevations corresponding to a distance between the contact points of the substrate;
    applying conductor runs to the first main side to connect the contact pads and the elevations;
    performing the step of applying the conductor runs at a time selected from a group consisting of before performing the step of applying the elevations and after performing the step of applying the elevations;

applying an adhesive that develops a force between the semiconductor chips and the substrate for fixing a position of the elevations and the contact points after hardening; and individually separating the semiconductor chips.

14. The method according to claim 13, wherein: the elevations are printed on.

15. The method according to claim 13, which comprises: electrodepositing ends of the conductor runs at least once; the conductor runs being conductor tracks.

16. The method according to claim 13, which comprises: applying a formation having a fissured surface to ends of the conductor runs before electrodepositing ends of the conductor runs; the conductor runs being conductor tracks.

* * * * *